United States Patent
Mellberg et al.

(10) Patent No.: US 6,385,048 B2
(45) Date of Patent: May 7, 2002

(54) EMI REDUCTION DEVICE AND ASSEMBLY

(75) Inventors: Hans T. Mellberg, Santa Cruz; Bertram Kim Cheong Chan, Sunnyvale; Susannah Gardner, San Carlos, all of CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/761,368

(22) Filed: Jan. 16, 2001

Related U.S. Application Data

(63) Continuation of application No. 09/320,412, filed on May 26, 1999, now Pat. No. 6,219,239.

(51) Int. Cl.[7] .............................. H05H 7/20; H05H 9/00
(52) U.S. Cl. .................... 361/704; 165/80.3; 174/35 R; 361/710; 361/715; 361/818
(58) Field of Search ............... 165/80.2, 80.3, 165/185; 174/16.3, 35 R, 35 GC; 257/718–719, 726–727; 361/704, 707–710, 715, 816, 818

(56) References Cited

U.S. PATENT DOCUMENTS

| | | |
|---|---|---|
| 5,053,924 A | 10/1991 | Kurgan |
| 5,136,120 A | 8/1992 | Craft et al. |
| 5,241,453 A | 8/1993 | Bright et al. |
| 5,278,351 A | 1/1994 | Herrick |
| 5,311,408 A | 5/1994 | Ferchau et al. |
| 5,357,404 A | 10/1994 | Bright et al. |
| 5,428,508 A | 6/1995 | Pronto |
| 5,566,052 A | 10/1996 | Hughes |
| 5,740,013 A | 4/1998 | Roesner et al. |
| 5,880,930 A | 3/1999 | Wheaton et al. |
| 6,043,983 A | 3/2000 | Taylor et al. |
| 6,053,771 A | 4/2000 | Hood, III et al. |
| 6,188,577 B1 * | 2/2001 | Liu .............................. 361/704 |
| 6,205,026 B1 * | 8/2001 | Wong et al. ................. 361/704 |

OTHER PUBLICATIONS

Mark I. Montrose; "EMC and the Printed Circuit Board, Design, Theory, and Layout Made Simple", pp. 70–74, 1998, IEEE; Order No. PC 5756.

* cited by examiner

Primary Examiner—Gregory Thompson

(57) ABSTRACT

An EMI reduction device is interposed between a printed circuit board (PCB) assembly and a heat sink. The PCB assembly includes a processor core that is the source of unintentional electromagnetic interference (EMI). The EMI reduction device contacts a heat sink which is positioned over the processor core such that it capacitively couples emissions from the processor core to a grounding plane resident in the PCB assembly, thereby reducing the unintentional EMI. Simultaneously, the EMI reduction device is able to maintain thermal contact with the heat sink.

20 Claims, 13 Drawing Sheets

EMI REDUCTION DEVICE AND ASSEMBLY

CROSS REFERENCE TO RELATED APPLICATION (S)

This is a continuation of application Ser. No. 09/320,412 filed on May 26, 1999 is now U.S. Pat. No. 6,219,239.

FIELD OF THE INVENTION

The present invention relates generally to electronic systems. More particularly, the invention relates to an electromagnetic interference (EMI) reduction device.

BACKGROUND OF THE INVENTION

A trend in the electronics industry is to generate smaller and faster electronic devices. As a result, these devices consume more power and hence, produce more heat. Excessive heat can cause significant damage to an electronic device thereby reducing its life. For this reason, various techniques are employed to eliminate or dissipate the heat generated from the electronic device. A heat sink is one such technique. A heat sink is thermally coupled to the electronic device and as such, allows the heat to flow from the electronic device through the heat sink to the surrounding open space.

In addition, the operation of these electronic devices is accompanied by the generation of electromagnetic radiation or energy. The emissions of the electromagnetic radiation can cause significant electronic interference or noise with other surrounding electronic circuitry. To reduce such disturbances, the source of these emissions is usually suppressed. However, the EMI suppression problem is further complicated when the electronic device is coupled to a heat sink. The heat sink acts as an antenna for the EMI energy thereby amplifying the EMI energy.

A common solution for suppressing EMI energy is to ground the heat sink. FIG. 1 illustrates an exemplary grounded heat sink. There is shown a heat sink 100 coupled to a grounded electronic device 102 that is mounted onto a printed circuit board (PCB) 104. In this example, the grounded electronic device 102 is a processor core having a silicon logic die 106. A thermal compound 108, such as a dielectric material, is placed between the heat sink 100 and the grounded electronic device 102 so that thermal contact is maintained and the heat generated by the device 102 is transferred to the heat sink 100.

Mounting fences 110 are positioned on four opposite sides of the PCB 104 in order to ground the heat sink 100. The mounting fences 110 are attached to the heat sink 100 and the PCB 104, which acts in this case as a ground plane. The mounting fences 110 provide a Faraday shield around the device 102 in order to shield the EMI energy generated from the clock circuitry internal to the processor 102 from damaging adjacent components and from releasing EMI energy outside of the heat sink 100.

Additional EMI suppression is provided by four sets of grounding pads 112a–112d on the PCB 104 that surround the processor 102, as shown in FIG. 2. The grounding pads 112a–112d minimize or ground EMI noise generated by the switching of all the component pins under maximum capacitive load. Thus, the combination of the grounding pads and the grounded heat sink dissipates the heat from the processor core and grounds the EMI energy generated by the processor core.

As the internal clock speed of processors increase, these processors will require more extensive EMI reduction or grounding. In some cases, the grounded heat sink approach may not be suitable to effectively eliminate the EMI emissions since this approach has a longer grounding path. As such, grounding may need to be performed closer to the silicon logic die in order to create a shorter grounding path that effectively shields the EMI energy emanating from the processor core.

Accordingly, there is a need for an EMI reduction technique that can minimize or eliminate EMI energy generated from a processor core closer to the source of the emissions and in such a manner that is cost efficient and easy to manufacture.

SUMMARY OF THE INVENTION

One aspect of the present invention provides an electronic assembly. The electronic assembly includes a circuit board including a surface and an electronic device mounted on the surface, a thermal dissipation device positioned over the surface of the circuit board and thermally contacting the electronic device, an Electromagnetic Interference (EMI) reduction device interposed between the circuit board and the thermal dissipation device, and at least one retention clip passing through the EMI reduction device and securing the thermal dissipation device to the circuit board. The EMI reduction device includes at least one compressible spacing element and contacts the circuit board and the thermal dissipation device.

In one embodiment, the at least one compressible spacing element contacts the circuit board and the thermal dissipation device.

In one embodiment, the at least one compressible spacing element has a hole defined therein. As such, the at least one retention clip passes through the hole of the at least one compressible spacing element.

In one embodiment, the at least one compressible spacing element is formed of an electrically conductive material. In one embodiment, the at least one compressible spacing element contacts a ground plane of the circuit board.

In one embodiment, the at least one compressible spacing element contacts the circuit board at a point spaced from the electronic device. As such, the EMI reduction device has no physical contact with the electronic device.

In one embodiment, the at least one compressible spacing element is a spring washer. In one embodiment, the at least one compressible spacing element includes a compressible coil.

In one embodiment, the at least one compressible spacing element includes a spring finger projecting from a surface of the EMI reduction device. As such, the EMI reduction device contacts the circuit board via the spring finger. In one embodiment, the EMI reduction device has an aperture defined therein. As such, the thermal dissipation device maintains thermal contact with the electronic device through the aperture.

In one embodiment, the electronic device is a processor.

Another aspect of the present invention provides a method of reducing Electromagnetic Interference (EMI) emissions emanating from and dissipating heat generated by an electronic device mounted on a circuit board. The method includes positioning a thermal dissipation device over the circuit board, interposing an EMI reduction device including at least one compressible spacing element between the circuit board and the thermal dissipation device, and securing the thermal dissipation device to the circuit board with at least one retention clip. As such, positioning the thermal dissipation device includes thermally contacting the electronic device with the thermal dissipation device, interposing the EMI reduction device includes contacting the circuit board and the thermal dissipation device with the EMI reduction device, and securing the thermal dissipation device includes passing the at least one retention clip through the EMI reduction device.

The present invention provides an EMI reduction device which is interposed between a printed circuit board (PCB) assembly and a heat sink. The PCB assembly includes a processor core which is the source of a large amount of electromagnetic interference. The EMI reduction device grounds the processor emissions by capacitively coupling them to the ground plane present in the PCB assembly.

BRIEF DESCRIPTION OF THE DRAWINGS

For a better understanding of the nature and objects of the invention, reference should be made to the following detailed description taken in conjunction with the accompanying drawings, in which.

Like reference numerals refer to corresponding parts throughout the several views of the drawings.

DETAILED DESCRIPTION OF THE INVENTION

Figure 1:
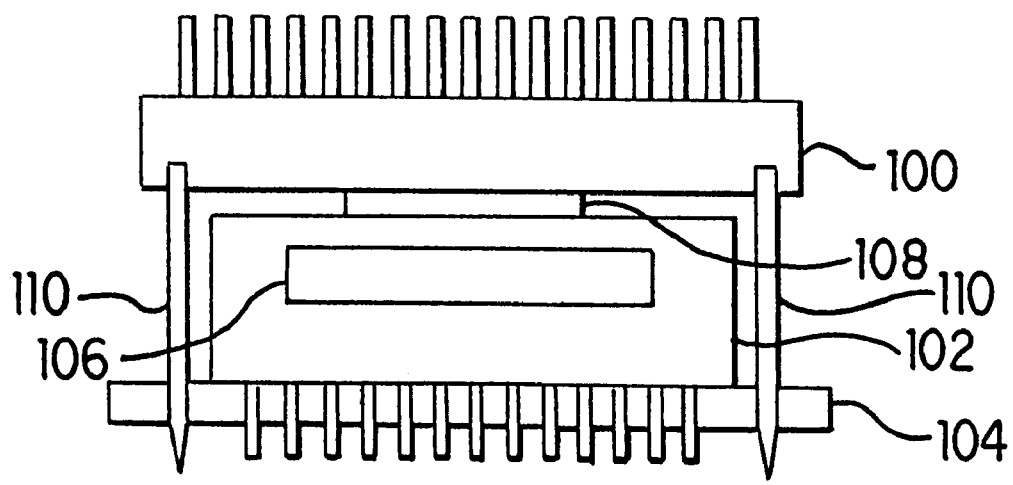
FIG. 1 is a schematic view of a prior art grounded heat sink assembly for a printed circuit board.
Figure 2:
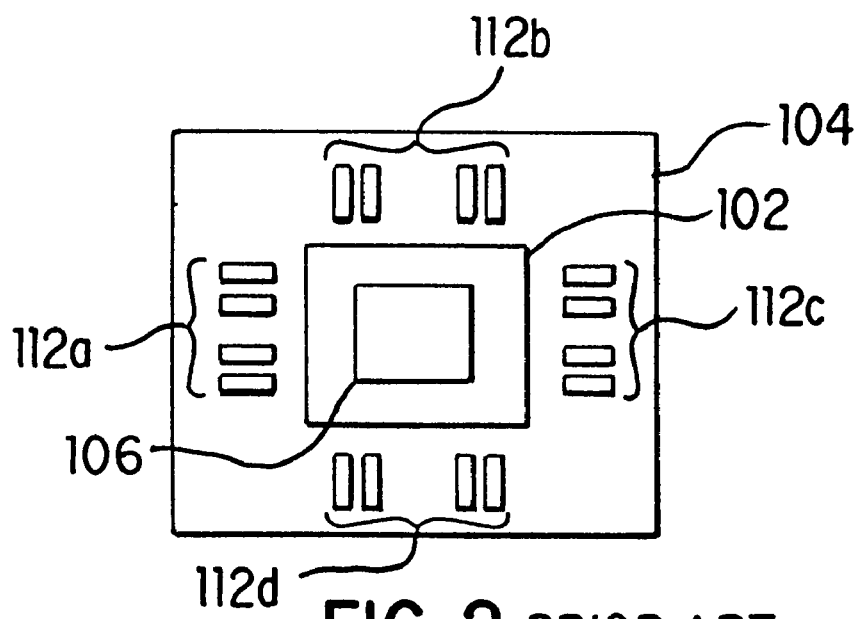
FIG. 2 is a top plan view of the printed circuit board used in the grounded heat sink assembly shown in FIG. 1.
Figure 3:
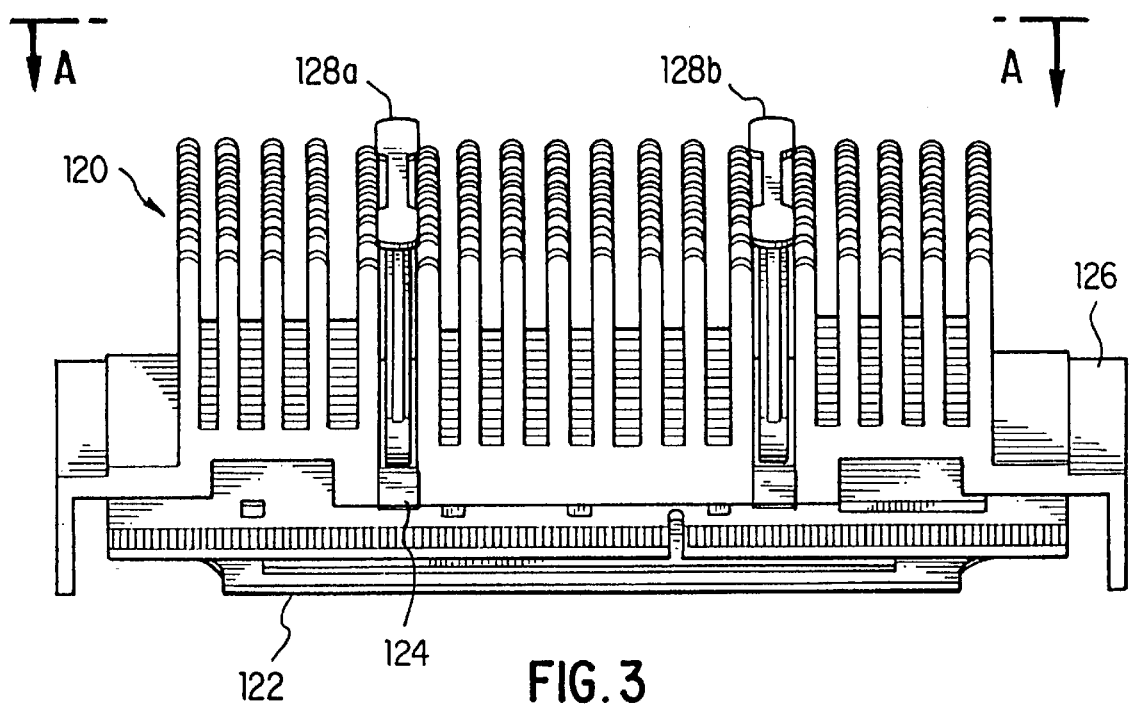
FIG. 3 is a perspective view of a processor module in accordance with a first embodiment of the present invention.
Figure 4:
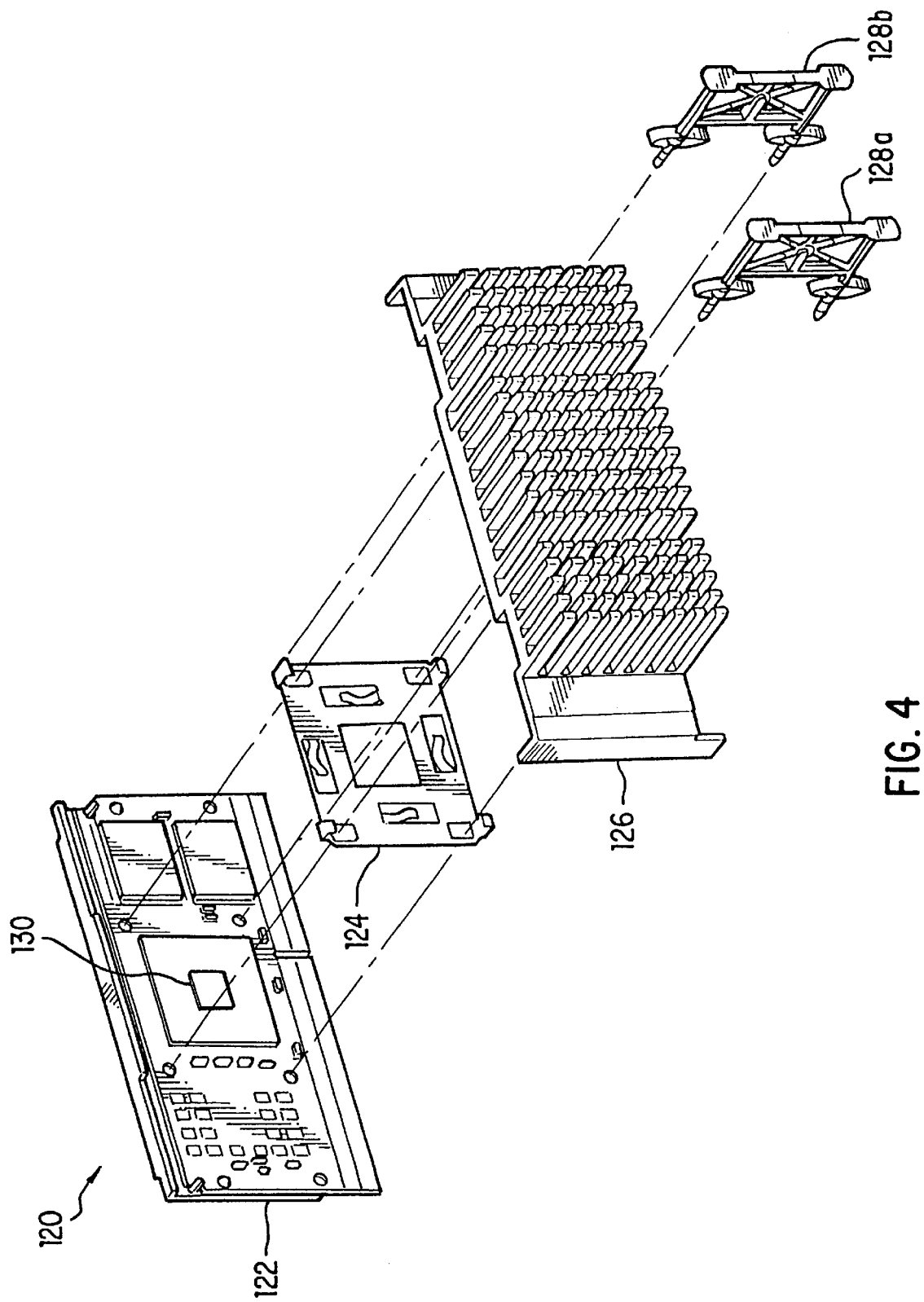
FIG. 4 is an exploded view of the components of the processor module shown in FIG. 3.

FIGS. 3 and 4 depict a processor module 120 having a PCB assembly 122, an EMI clip or reduction device 124, a heat sink 126, and a pair of heat sink retention clips 128a–128b. The PCB assembly 122 includes a processor core 130. The EMI clip 124 is positioned onto the PCB assembly 122 surrounding the processor core 130 and is used to efficiently shield the EMI emissions generated from the processor core 130. The EMI clip 124 is removably mounted to the heat sink 126. The heat sink 126 is thermally coupled to the PCB assembly 122 and is used to transfer the heat from the electronic components to the heat sink 126. A pair of heat sink retention clips 128a and 128b are used to fasten the heat sink 126 to the PCB assembly 122.

Figure 5:
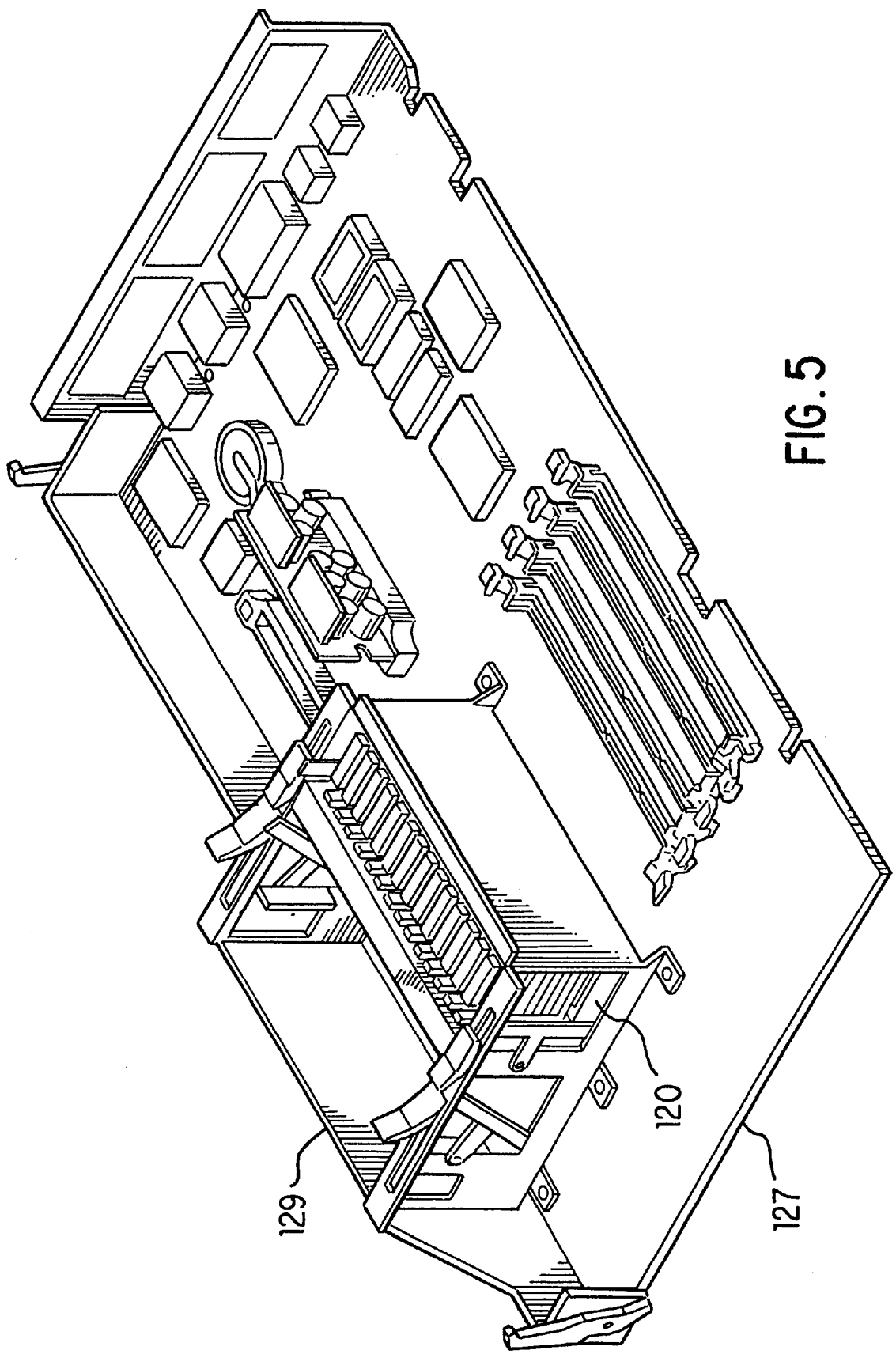
FIG. 5 illustrates the processor module positioned on a printed circuit board as part of computer system in accordance with the embodiments of the present invention.

The processor module 120 can be removably mounted onto a motherboard or other type of circuit board. For example, as shown in FIG. 5, the processor module 120 is positioned onto a motherboard 127 through a processor retention assembly 129. The motherboard 127 can be part of a computer system, subsystem, or the like.

Preferably, the PCB assembly 122 is a Single Edge Contact Cartridge 2 (SECC2) manufactured by the Intel Corporation. The SECC2 supports "slot" type processors. A slot is a connector that is resident on a motherboard and which supports the Intel P6 microprocessor bus. Previously, microprocessors were mounted onto a motherboard through a socket. In a slot-type processor, the processor is placed on a PCB known as a single edge contact (SEC). The SEC has pins on an edge of the card which is inserted into a 242-pin slot on the motherboard. This pin construction is otherwise known as an edge finger connection.

A more detailed discussion of the SECC2 can be found in Intel Corporation, Single Edge Contact Connector 2 (S.E.C.C.2) Thermal Interface Material Functional Requirements, Order No: 244458-001, November 1998; Intel Corporation, Single Edge Contact Cartridge 2 (S.E.C.C.2) Heat Sink Attachment and Heat Sink Functional Requirements Order Number: 244456-001, Nov. 23, 1998; and Intel Corporation, S.E.C.C.2 Heat Sink Installation and Removal Process, Order Number 244454-001, December 1998 which are hereby incorporated by reference as background information.

Figure 6:
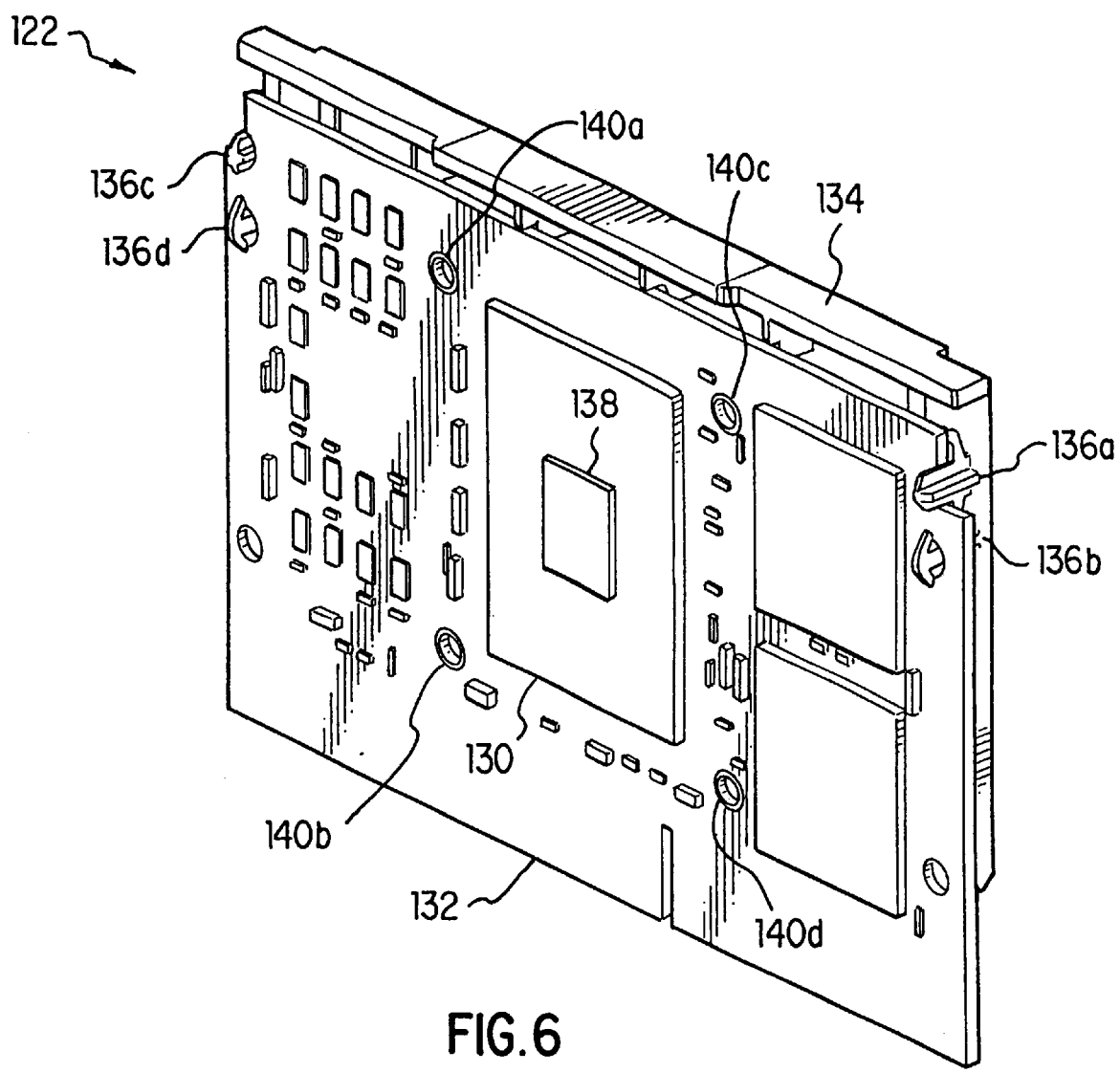
FIG. 6 is a front perspective view of the printed circuit board assembly shown in FIGS. 3 and 4.

FIG. 6 illustrates the SECC2 122. There is shown a printed circuit board (PCB) 132 and a cover 134. The PCB 132 is preferably a substrate constructed of a multilayer plastic laminate, such as a plastic land grid array or organic land grid array processor core substrates. The substrate 132 has an edge finger connection. In addition, the substrate 132 includes a ground plane. The cover 134 is used to protect the PCB 132 and is removably mounted to the PCB 132 through a set of snaps 136a–136d. However, it should be noted that the technology of the present invention is not constrained to the SECC2, to any particular circuit board, or to any particular circuit board layout.

Figure 7:
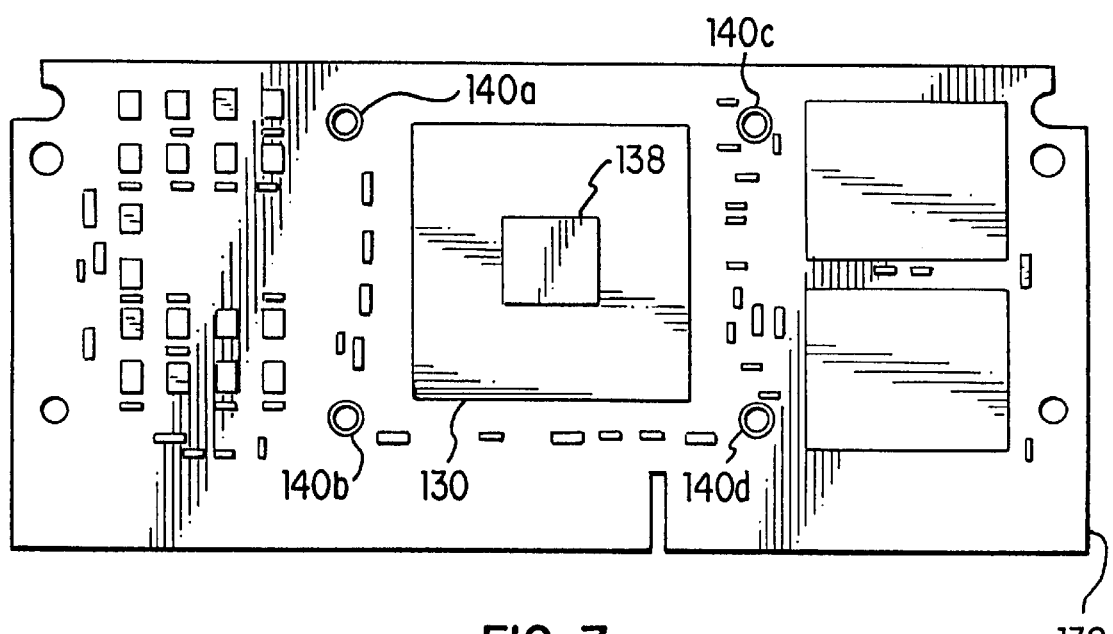
FIG. 7 is a top plan view of the printed circuit board shown in FIG. 6.

FIG. 7 illustrates the PCB 132 in further detail. There is a processor core 130 that includes a silicon logic die 138. The PCB 132 includes four attachment holes 140a–140d through which the heat sink retention clips 128a and 128b are fit so that the heat sink 126 can be attached to the PCB assembly 122. In addition, surrounding the logic die 138, there are other electronic components, such as but not limited to cache memory, resistors, capacitors, and the like. However, in this embodiment of the PCB 132, there are no grounding pads.

Figure 8:
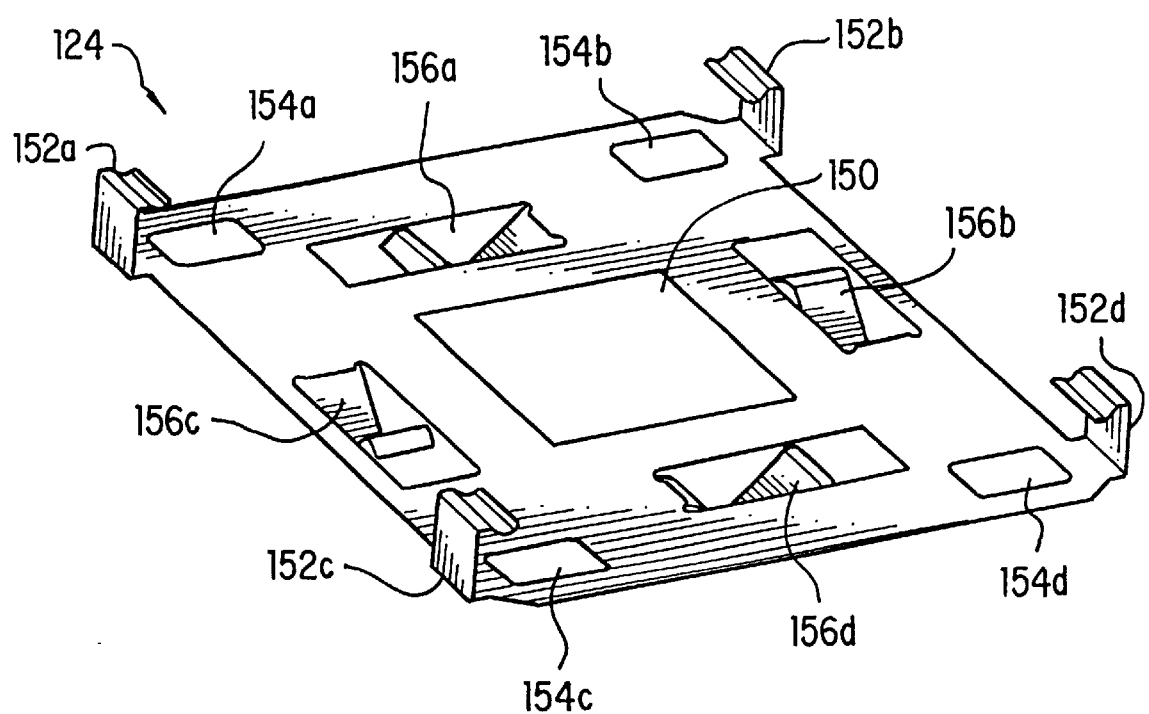
FIG. 8 is a perspective view of the bottom side of the EMI clip shown in FIGS. 3 and 4.

FIG. 8 illustrates the EMI clip 124. The EMI clip 124 has a rectangular-shaped frame including a die aperture 150, four mounting clip tabs 152a–152d, four attachment holes 154a–154d, and four spring contact fingers 156a–156d. The die aperture 150 is of a rectangular shape and is located in the center of the EMI clip 124. The EMI clip 124 is positioned over the logic die 138 so that the die aperture 150 allows the logic die 138 to be in direct physical contact with the surface of the heat sink 126.

The four mounting clip tabs 152a–152d are used to attach the EMI clip 124 to the heat sink 126. The mounting clip tabs 152a–152d are located on the outer periphery of the EMI clip 124 and are situated in each corner of the top side of the EMI clip 124.

The mounting holes 154a–154d are located on the surface of the top side of the EMI clip 124 and each mounting hole 154a–154d is located at a particular corner of the EMI clip 124. Each of the four mounting holes 154a–154d are aligned with a respective mounting hole 140a–140d on the PCB 132 and with a respective mounting hole 166a–166d on the heat sink 126. The retention clips 128 are inserted through the mounting holes 166a–166d on the heat sink 126 in a downward direction through the mounting holes 154a–154d on the EMI clip 124 through the mounting holes 140a–140d on the PCB 132.

The four spring contact fingers 156a–156d are situated on the bottom side of the EMI clip 124 and allow the EMI clip 124 to maintain physical contact on four sides of the processor core 130. The spring contact fingers 156a–156d are the only portion of the EMI clip 124.that is in physical contact with the PCB 132. The spring contact fingers 156a–156d ensure that the frame of the EMI clip 124 does not protrude directly onto any of the components of the PCB 132. Direct contact with the processor substrate 132 would damage the electronic components positioned under the EMI clip 124. As such, each of the spring contact fingers 156a–156d is positioned on the PCB 132 in an area where there are no electronic components.

Figure 9:
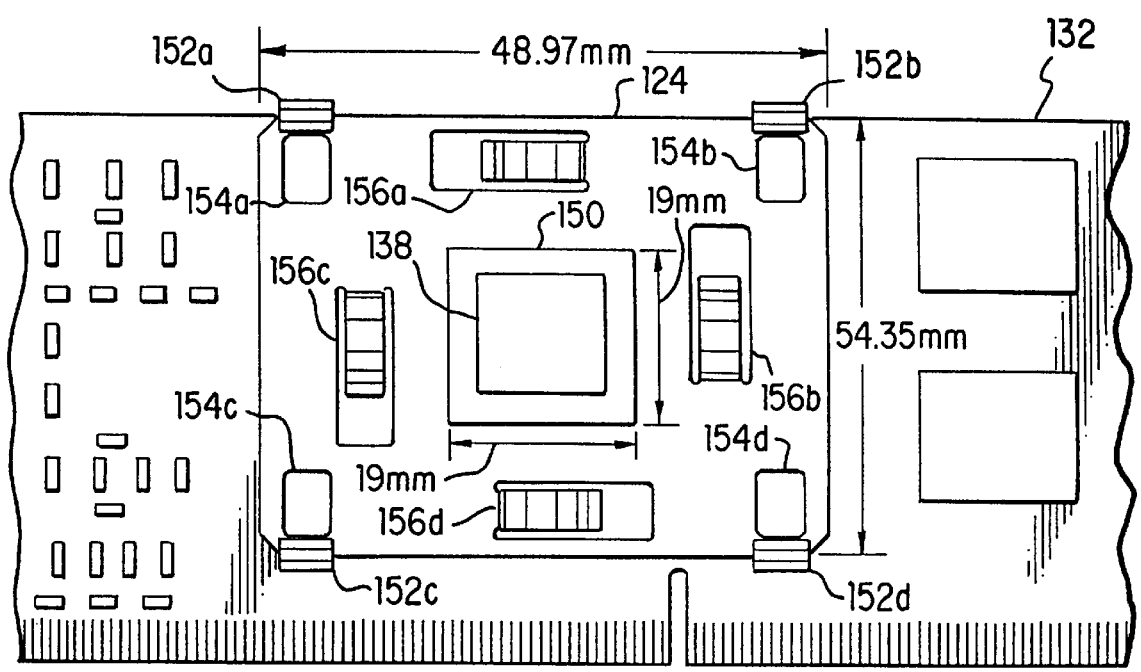
FIG. 9 is a top plan view of the EMI clip positioned onto the printed circuit board assembly in accordance with a first embodiment of the present invention.

The shape, size and dimension of the EMI clip 124 is tailored for the particular processor substrate 132 to which the EMI clip 124 is coupled. FIG. 9 illustrates the placement of the EMI clip 124 onto a SECC2 122. For this embodiment, the EMI clip 124 is approximately 48.97 mm by 54.35 mm. The die aperture 150 is 19 mm by 18 mm and is constructed such that there is a 6 mm distance between the outer edge of the processor aperture to the outer edge of the processor logic die. It should be noted that the present invention is not constrained to an EMI clip 124 having the particular shape, size and dimensions described herein and one skilled in the art can easily modify the design of the EMI clip 124 to suit other PCBs or the like.

The electromagnetic bandwidth of the processor core can extend to include multiple times the advertised processor clock speed. In the case of an Intel Pentium II processor with an internal clock speed of 500 MHz, the EMI bandwidth can extend to 2500 MHz or more. The EMI clip 124 reduces portions of that bandwidth with varying shielding effectiveness and can vary depending on the mechanical dimensions of the EMI clip 124. Another modifier to EMI reduction is the mechanical pressure that exits both on the heat sink 126 and on the processor core 130. The higher the pressure the more effective the capacitive coupling becomes and hence the EMI reduction.

Preferably, the EMI clip 124 is constructed of thin steel sheet metal. However, the present invention is not constrained to any particular type of metal and can be constructed of any material, such as but not limited to stainless steel, beryllium copper, phosher bronze, hardened steel, spring steel, and the like.

Figure 12:
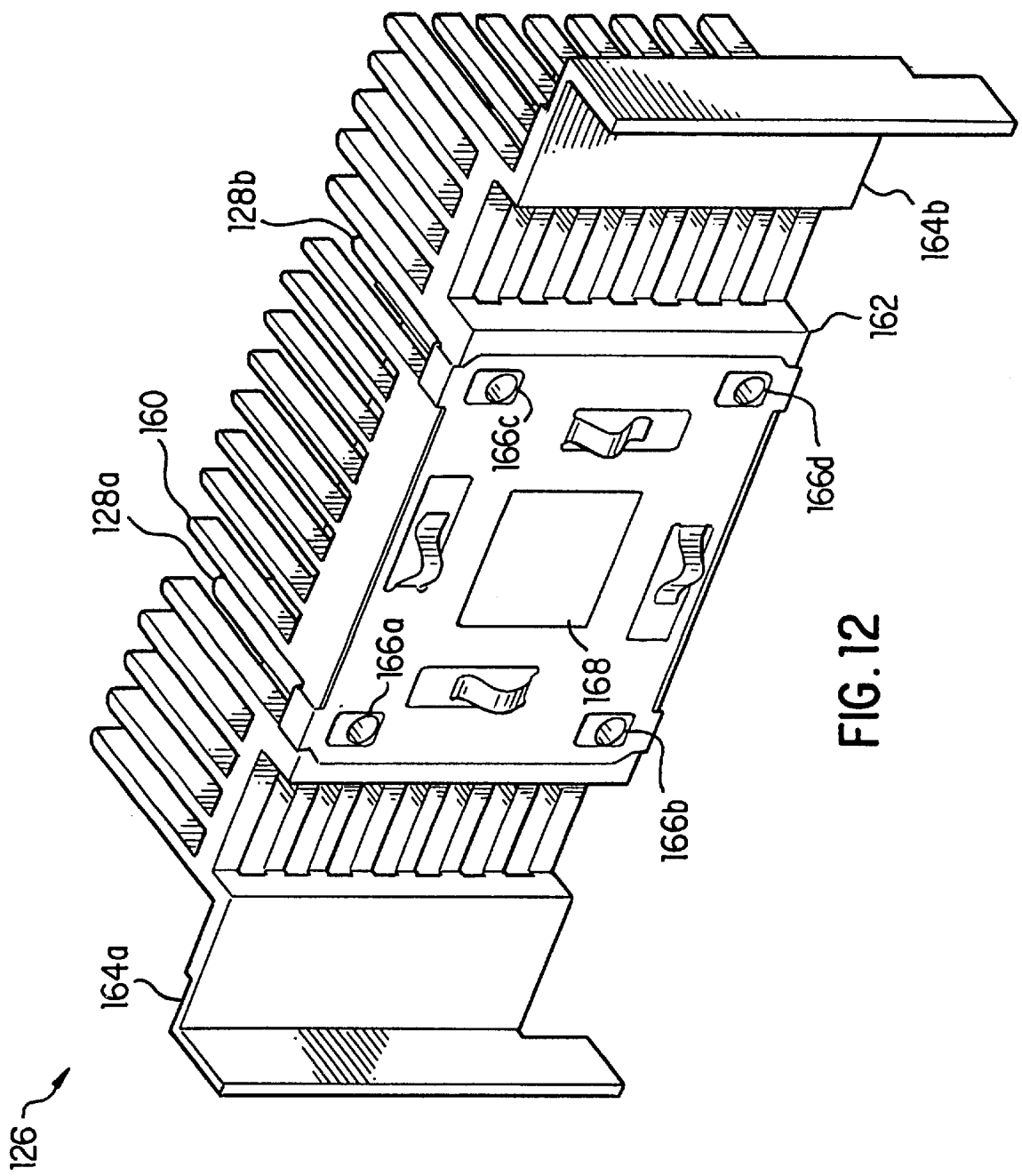
FIG. 12 is a rear perspective view of the heat sink with the EMI clip attached thereto in accordance with the first embodiment of the present invention.

Referring to FIG. 12, the bottom side of the EMI clip 124, that side which touches the PCB 132, is coated with a dielectric layer that ensures that the EMI clip 124 does not short the electronic components mounted on the surface of the PCB 132.

An example of such a dielectric coating is powder paint, in particular, the epoxy power coatings based on epoxy resins.

The placement of the EMI clip 124 over the processor core 130 and in the manner described above is effective in reducing the EMI emissions from the processor core 130. Although, the EMI clip 124 is not in direct electrical contact with the processor core 130, its close proximity to the processor core 130 capacitively couples these emissions to the ground plane of the substrate 132 and through a shorter grounding path. As a result, the emissions are minimized or eliminated directly at the processor core 130.

Figure 10:
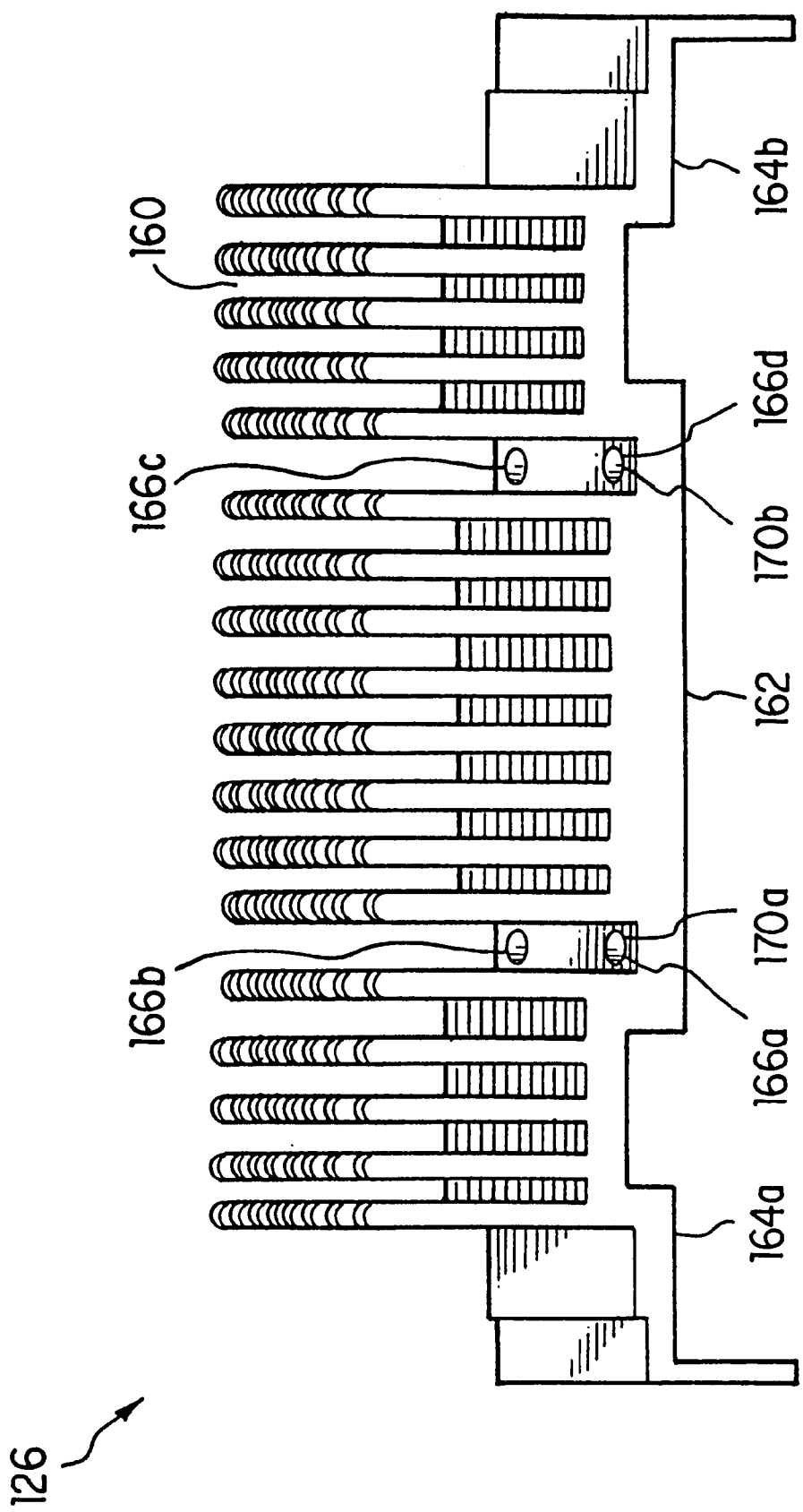
FIG. 10 is a perspective view of the heat sink shown in FIGS. 3 and 4 in accordance with the embodiments of the present invention.
Figure 11:
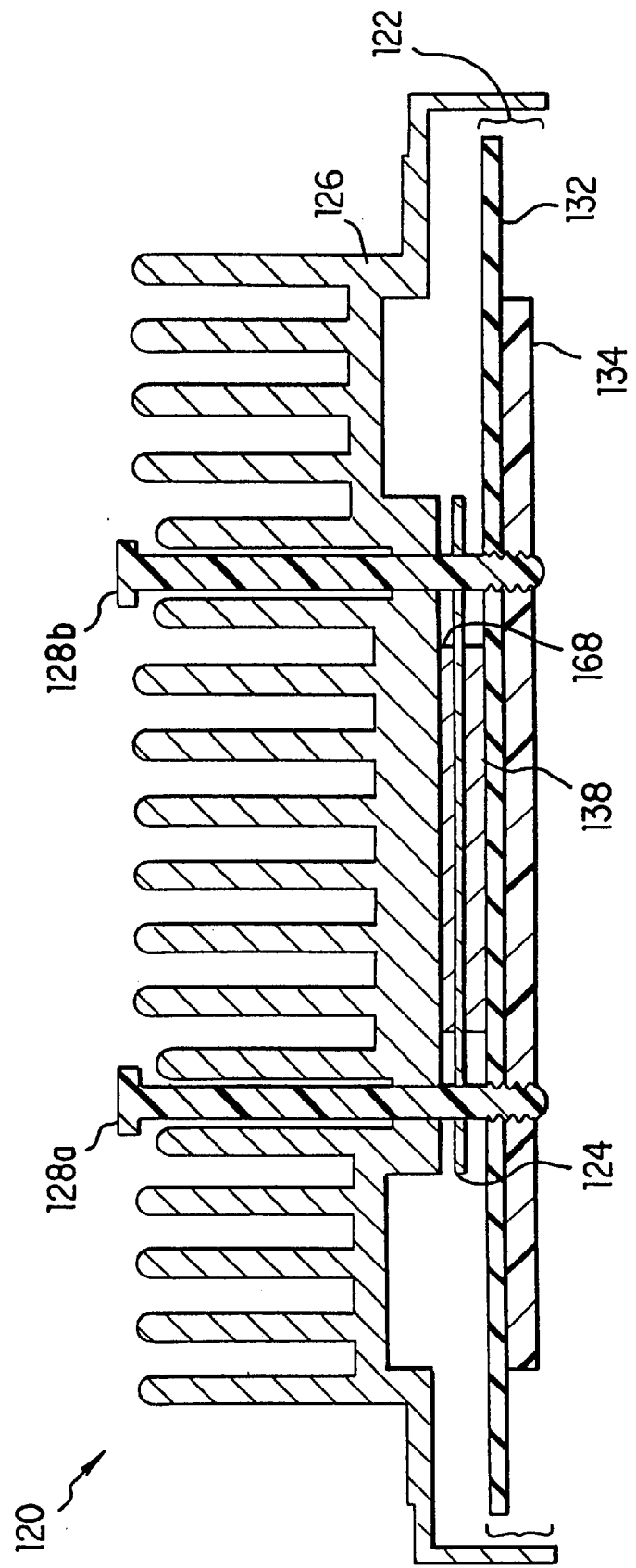
FIG. 11 is cross-sectional view of the processor module taken along plane A—A shown in FIG. 3.

FIGS. 10 and 11 illustrate the heat sink 126. The heat sink 126 has a number of fins 160, a base portion 162, and two skirts 164a–164b. The fins 160 project outwardly and upwardly from the base portion 162. The base portion 162 extends over and covers the processor core 130 thereby providing the maximum amount of thermal contact area between the processor core 130 and the heat sink 126. The two skirts 164a–164b extend laterally and downwardly from the base portion 162 and extends over and covers opposite sides of the PCB assembly 122.

The fins 160 are eliminated where the heat sink retention clips 128a and 128b are positioned (see FIGS. 3 and 4) into two grooves 170a and 170b situated on the top surface of the base portion of the heat sink 126. The groves 170 a and 170b include mounting holes 166a–166b that enable the heat sink retention clips 128a and 128b to fit through the top surface of the base portion 162. The retention clips 128a and 128b are inserted through the mounting holes 166a–166b on the heat sink 126 in a downward direction through the mounting holes 154a–154b on the EMI clip 124 through the mounting holes 140a–140d on the PCB 132.

The heat sink retention clips 128a and 128b are made from a flexible material that is non-electrically conductive, such as plastic. The heat sink retention clips 128a and 128b are secured at one end in any appropriate manner, and in the present example by barbed ties. Preferably, the heat sink retention clips 128a and 128b are those heat sink retention clips designed for the SECC2 and which are manufactured by ITW Fastex.

FIG. 12 illustrates the bottom side of the base portion 162 of the heat sink 126. There is shown the EMI clip 124 mounted to the base portion 162 of the heat sink 126. Each mounting clip 152a–152d is fitted over onto a corresponding groove 170a and 170b on the base portion of the heat sink 126.

The heat sink 126 is made of aluminum that is chromate conversion coated and is electrically conductive. A thermal compound 168, such as a dielectric layer, is placed on the bottom side of the base portion 162 of the heat sink 126. This dielectric layer is used to provide high dielectric capacity and to provide a high thermal conductivity between the processor logic die 138 and the heat sink 126. An example of such a compound is MCM-STRATE® manufactured by Power Devices, Inc. However, the present invention is not constrained to any particular type of material and other materials having the same properties can also be used.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

In particular, one skilled in the art can alter the EMI clip described above to include additional spring fingers in order to provide more capacitive contacts between the EMI clip and the substrate. In another alternate embodiment, the EMI clip can be used in conjunction with grounding pads that are positioned on the substrate. In yet another embodiment, the EMI clip can be made an integral part of the heat sink and not a separate device. Furthermore, the EMI clip can be made without the dielectric coating on the bottom surface thereby making electrical contact with the PCB. Alternatively, the EMI clip can be applied to a processor that is mounted directly onto a motherboard and is not constrained to edge finger connection devices.

Figure 13:
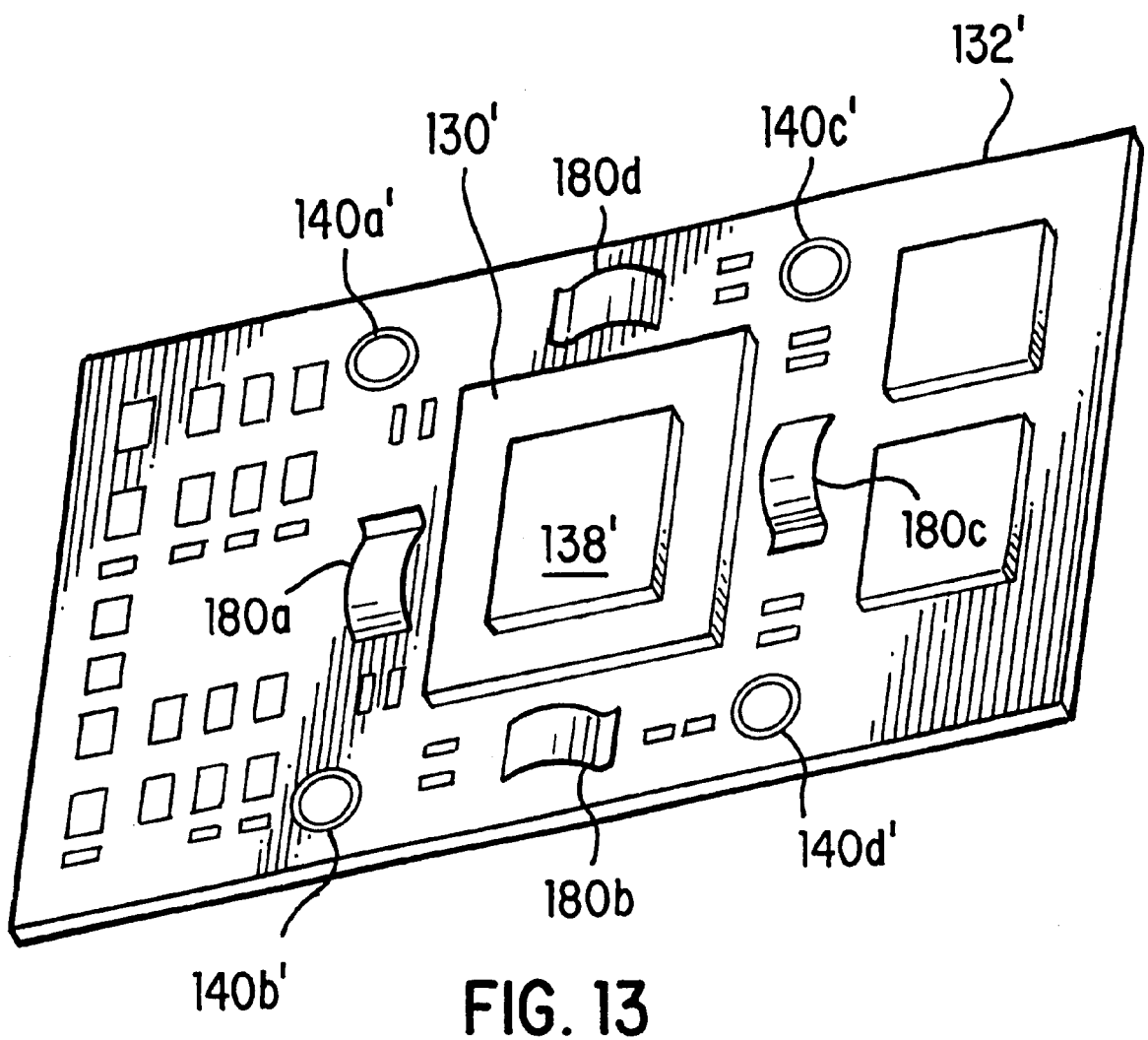
FIG. 13 is an isometric view of a printed circuit board having spring fingers mounted onto the PCB assembly in accordance with a second embodiment of the present invention.

FIG. 13 illustrates a second embodiment of the present invention. In this embodiment, there is no EMI clip 124 rather spring fingers 180a–180d mounted directly onto the printed circuit board 132'. Preferably, a spring finger 180a–180d is mounted on each side surrounding the processor core 130'. As shown in FIG. 13, there are four spring fingers 180a–180d mounted directly onto the circuit board 132'. However, the number of spring fingers 180a–180d and their position of the circuit board 132' is not a limitation of this embodiment.

A heat sink is mounted directly over the circuit board 132' and coupled with retention clips in the manner described above. The bottom surface of the heat sink will be in direct physical contact with the processor die 138' and the top surface of the spring fingers 180a–180d. As such, the emissions from the processor die 138' are capacitively coupled to the ground plane in the circuit board 132' and suppressed directly at the source of the emissions.

Figure 14:
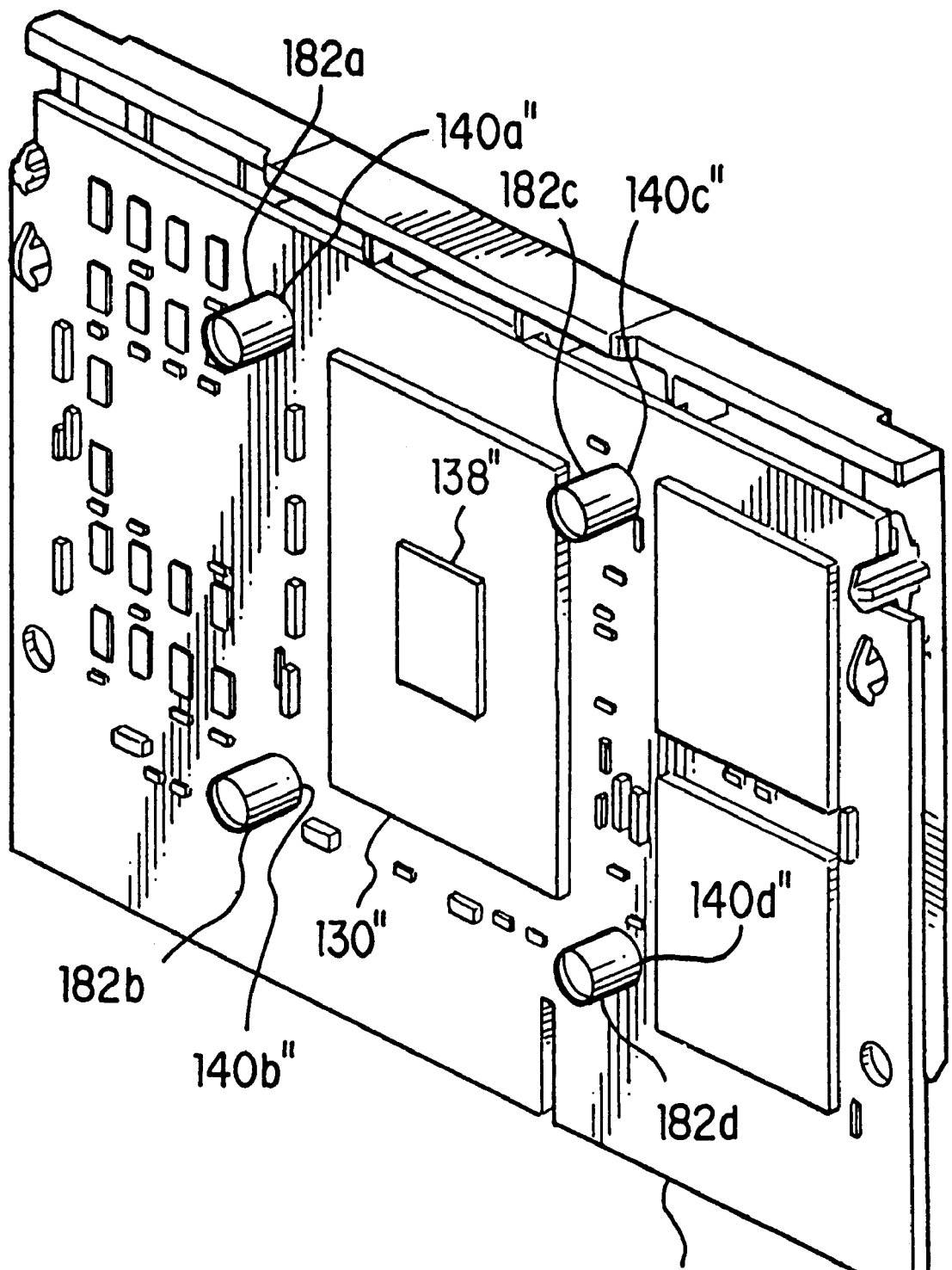
FIG. 14 is an isometric view of a printed circuit board having spring washers in accordance with a third embodiment of the present invention.

FIG. 14 illustrates a third embodiment of the present invention. In this embodiment, the ground plane of the circuit board 132" is extended to and through the mounting holes 140a"–140d" on the circuit board 132". A spring washer 182a–182d is mounted in each mounting hole 140a"–140d". A heat sink is mounted over the top surface of the circuit board 132".

The spring washers 182a–182d are formed of an electrically conductive material, such as but not limited to thin sheet steel metal and are shaped as a compression coil. The spring washers 182a–182d serve to ground the emissions from the processor core 130" while ensuring that the placement of the heat sink on top of the circuit board 132" does not damage the processor core 130" and the electronic components mounted thereon.

Each spring washer 182a–182d has a hollow core that is wide enough to allow a retention clip to fit through it thereby allowing the heat sink to be fastened to the circuit board 132" in the manner described above. When the heat sink is fastened to the circuit board 132", the spring washers 182a–182d are compressed by the weight of the heat sink and the bottom surface of the heat sink is in direct physical contact with the processor die 138" and the top surface of the spring washers 182a–182d. As such, the emissions from the processor die 138" are grounded to the ground plane in the circuit board 132" and suppressed directly at the source of the emissions.

What is claimed is:

1. An electronic assembly, comprising:
    a circuit board including a surface and an electronic device mounted on the surface;
    a thermal dissipation device positioned over the surface of the circuit board and thermally contacting the electronic device;
    an Electromagnetic Interference (EMI) reduction device interposed between the circuit board and the thermal dissipation device, the EMI reduction device including at least one compressible spacing element; and
    at least one retention clip passing through the EMI reduction device and securing the thermal dissipation device to the circuit board,
    wherein the EMI reduction device contacts the circuit board and the thermal dissipation device.

2. The electronic assembly of claim 1, wherein the at least one compressible spacing element contacts the circuit board and the thermal dissipation device.

3. The electronic assembly of claim 1, wherein the at least one compressible spacing element has a hole defined therein, wherein the at least one retention clip passes through the hole of the at least one compressible spacing element.

4. The electronic assembly of claim 1, wherein the at least one compressible spacing element is formed of an electrically conductive material.

5. The electronic assembly of claim 1, wherein the at least one compressible spacing element contacts a ground plane of the circuit board.

6. The electronic assembly of claim 1, wherein the at least one compressible spacing element contacts the circuit board at a point spaced from the electronic device, and wherein the EMI reduction device has no physical contact with the electronic device.

7. The electronic assembly of claim 1, wherein the at least one compressible spacing element is a spring washer.

8. The electronic assembly of claim 1, wherein the at least on e compressible spacing element includes a compressible coil.

9. The electronic assembly of claim 1, wherein the at least one compressible spacing element includes a spring finger projecting from a surface of the EMI reduction device, wherein the EMI reduction device contacts the circuit board via the spring finger.

10. The electronic assembly of claim 9, wherein the EMI reduction device has an aperture defined therein, wherein the thermal dissipation device maintains thermal contact with the electronic device through the aperture.

11. The electronic assembly of claim 1, wherein the electronic device is a processor.

12. A method of reducing Electromagnetic Interference (EMI) emissions emanating from and dissipating heat generated by an electronic device mounted on a circuit board, the method comprising the steps of:

positioning a thermal dissipation device over the circuit board, including thermally contacting the electronic device with the thermal dissipation device;

interposing an EMI reduction device including at least one compressible spacing element between the circuit board and the thermal dissipation device, including contacting the circuit board and the thermal dissipation device with the EMI reduction device; and securing the thermal dissipation device to the circuit board with at least one retention clip, including passing the at least one retention clip through the EMI reduction device.

13. The method of claim 12, wherein the step of interposing the EMI reduction device between the circuit board and the thermal dissipation device includes contacting the circuit board and the thermal dissipation device with the at least one compressible spacing element.

14. The method of claim 12, wherein the at least one compressible spacing element has a hole defined therein, wherein the step of securing the thermal dissipation device to the circuit board includes passing the at least one retention clip through the hole of the at least one compressible spacing element.

15. The method of claim 12, wherein the step of interposing the EMI reduction device between the circuit board and the thermal dissipation device includes contacting a ground plane of the circuit board.

16. The method of claim 12, wherein the at least one compressible spacing element is formed of an electrically conductive material.

17. The method of claim 12, wherein the at least one compressible spacing element is a spring washer.

18. The method of claim 12, wherein the at least one compressible spacing element includes a compressible coil.

19. The method of claim 12, wherein the at least one compressible spacing element includes a spring finger projecting from a surface of the EMI reduction device, wherein the step of interposing the EMI reduction device between the circuit board and the thermal dissipation device includes contacting the circuit board with the spring finger.

20. The method of claim 19, wherein the EMI reduction device has a n aperture defined therein, wherein the step of positioning the thermal dissipation device over the circuit board includes contacting the electronic device with the thermal dissipation device over through the aperture of the EMI reduction device.

* * * * *

UNITED STATES PATENT AND TRADEMARK OFFICE
CERTIFICATE OF CORRECTION

PATENT NO. : 6,385,048 B2
DATED : May 7, 2002
INVENTOR(S) : Mellberg et al.

It is certified that error appears in the above-identified patent and that said Letters Patent is hereby corrected as shown below:

Column 5,
Line 14, delete "128" and insert therefor -- 128a and 128b --

Column 6,
Line 27, delete "groves 170 a" and insert therefor -- grooves 170a --
Lines 28 and 31, delete "holes 166a-166b" and insert therefor -- holes 166a-166d --
Line 33, delete "holes 154a-154b" and insert therefor -- holes 154a-154d --

Column 8,
Line 49, delete "on e" and insert therefor -- one --

Column 10,
Line 20, before "aperture" delete "a n" and insert therefor -- an --

Signed and Sealed this

Twenty-fourth Day of June, 2003

JAMES E. ROGAN
*Director of the United States Patent and Trademark Office*